United States Patent
Yamada (10) Patent No.: US 8,509,006 B2
(45) Date of Patent: Aug. 13, 2013

(54) SEMICONDUCTOR DEVICE AND METHOD OF DETECTING ABNORMALITY ON SEMICONDUCTOR DEVICE

(75) Inventor: Junichi Yamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 136 days.

(21) Appl. No.: 13/020,518

(22) Filed: Feb. 3, 2011

(65) Prior Publication Data

US 2011/0194360 A1 Aug. 11, 2011

(30) Foreign Application Priority Data

Feb. 8, 2010 (JP) ................. 2010-025966

(51) Int. Cl.
*G11C 7/00* (2006.01)
(52) U.S. Cl.
USPC ................. 365/189.07; 365/230.06
(58) Field of Classification Search
USPC ....................... 365/189.07, 230.06
See application file for complete search history.

(56) References Cited

U.S. PATENT DOCUMENTS

| 5,606,527 A | 2/1997 | Kwack et al. |
| 6,111,801 A | 8/2000 | Brady |
| 2009/0063918 A1* | 3/2009 | Chen et al. ............ 714/721 |

FOREIGN PATENT DOCUMENTS

| JP | 5-159600 A | 6/1993 |
| JP | 7-192500 A | 7/1995 |
| JP | 2000-353399 A | 12/2000 |

* cited by examiner

*Primary Examiner* — Hoai V Ho
(74) *Attorney, Agent, or Firm* — Foley & Lardner LLP (57) ABSTRACT

A semiconductor device includes: a plurality of word lines; a word line driver; a first detection circuit; and a control circuit. The plurality of word lines is connected to gates of a plurality of memory cell transistors, respectively. The word line driver supplies one of a selection voltage and a non-selection voltage to each of the plurality of word lines. The first detection circuit detects a first current flowing into the word line driver through a wiring supplying the selection voltage when the selection voltage is supplied to one of the plurality of word lines through the word line driver. The control circuit detects abnormality of the plurality of word lines and the word line driver based on the first current.

11 Claims, 5 Drawing Sheets

SEMICONDUCTOR DEVICE AND METHOD OF DETECTING ABNORMALITY ON SEMICONDUCTOR DEVICE

INCORPORATION BY REFERENCE

This application is based upon and claims the benefit of priority from Japanese patent application No. 2010-025966 filed on Feb. 8, 2010, the disclosure of which is incorporated herein in its entirety by reference.

BACKGROUND OF THE INVENTION

1. Field of the Invention

The present invention relates to a semiconductor device and a method of detecting abnormality on a semiconductor device, and more particularly relates to a test for a word line and a word line driver in a memory cell array in a semiconductor device.

2. Description of Related Art

A method is known for testing a memory cell array in a semiconductor device (e.g.: a memory, a memory embedded microcomputer) having a memory circuit. Typically, a test method checks whether or not reading from and writing to a memory cell are normal, and indirectly checks whether or not a word line, a bit line and a peripheral circuit in a memory cell array are normal. That is, a trouble is not directly detected. Also, in a flash memory, a writing operation takes so much time as compared with a reading operation. In addition, in order to carry out an overwriting operation, an erasing operation whose time is longer than that of the writing operation is required. This causes a demerit that a test time for a flash memory is longer than that for a RAM such as a SRAM (static random access memory) and a DRAM (dynamic random access memory) in which a reading operation takes almost the same time as a wiring operation. In order to reduce the test time, a simple test method that does not require the reading from and writing to the memory cell is desired.

With regard to the test that does not require the reading from and writing to the memory cell, for example, Japanese patent publication number JP-A-Heisei 5-159600 (patent literature 1) discloses a test circuit of a semiconductor memory. This test circuit is provided with a semiconductor memory, a transistor column, a pre-charging means; a grounding means and a judging means. The semiconductor memory includes a memory cell array that includes at least a word line. The transistor column is composed of a plurality of transistors, which is connected in parallel between a power source side and a ground side respectively. In each of the plurality of transistors, a decoding output of the semiconductor memory is supplied to a gate through the word line. The pre-charging means pre-charges a drain side of the transistor column in accordance with a control signal. The grounding means grounds a source side of the transistor column in accordance with the control signal. The judging means judges a failure of the word line, in accordance with the potential of the drain side of the transistor column.

Specifically, the patent literature 1 describes as follows. In this testing circuit, the transistor (the transistor column) whose gate is connected to the word line is arranged on the side opposite to a row decoder with the word line between, and its transistor is used to directly monitor the voltage of the word line. Consequently, the test time of the word line is reduced as compared with the conventional method that indirectly judges whether or not the word line is good on the basis of the reading from and writing to the memory cell. Specifically, in accordance with the control signal, an input of an inverter connected to the drain side of the transistor column is pre-charged to a power source voltage level, and after that, one word line is selected. As for an output of the inverter, its output timing in the case that only one word line is normally selected is different from its output timing in the case that a failure causes the plurality of word lines to be multiply selected. Thus, by measuring its output timing by the judging means, it can be judged whether or not the word line is normal. Also, in a case of a failure in which the word line is not selected at all, the output of the inverter still remains at the ground level. Hence, it can be similarly judged whether or not the word line is good.

Also, with regard to the test that does not require the reading from and writing to the memory cell, Japanese patent publication number JP-P 2000-353399A (corresponding U.S. Pat. No. 6,111,801A: patent literature 2) discloses a method of testing a word line of a memory array and a related circuit. Here, the memory array has a plurality of memory cells arranged on a plurality of rows. Each of the plurality of rows has each of word lines connected to each of the plurality of memory cells. In order to activate at least one of the respective word lines in accordance with a corresponding address signal that is decoded by a decoding circuit, the related circuit has the decoding circuit that is connected to the word lines. The test method is characterized by having the respective steps of applying the address signal to the decoding circuit in order to activate the corresponding one of the respective word lines; and monitoring the corresponding one of the respective word lines in order to determine whether or not the corresponding one of the respective word lines is activated.

Specifically, this is described as follows. In this test method, a row test circuit is arranged in a memory cell array, and the row test circuit is used to monitor whether or not the word line is activated. Thus, although a complex test pattern is conventionally required and a long calculation time is required in order to execute the test, its cost is reduced. Further specifically, in the row test circuit, a latch block is arranged for each word line, and a state of activation="1" or non-activation "0" of the word line is held therein. If the word line is normally selected, "1" is returned through a wired OR. Thus, it can be directly tested whether or not the "row" is normal. Hence, the test cost can be suppressed.

JP-A-Heisei 5-159600 and JP-P 2000-353399A describe the tests that do not require the reading from and writing to the memory cell. However, the present inventor has now discovered the following problems by the research.

JP-A-Heisei 5-159600 has a problem that it is difficult to design the test circuit. In this test circuit, a time until the input voltage of the inverter arrives at the ground level in the case when one word line is normally selected is different from that in the case when the abnormality causes the plurality of word lines to be selected. Thus, it is required to measure this time difference by the judging means. However, in order to obtain a merit that the test time is made short, the time for the potential change is required to be similar to or shorter than at least the time necessary for the reading from and writing to the memory cell. On the other hand, when no word line is selected, the input of the inverter implies the power source voltage. However, actually, there is the potential change caused by leakage. Thus, even if no word line is selected and if the measurement time is excessively long, the input of the inverter will arrives at the ground level in a short time. At the test under a high temperature, the time for the potential change caused by the leakage becomes shorter. Thus, it is considered that the judging means is required to be able to measure the timing at a precision in a range between several nanoseconds and several tens of nanoseconds. This implies that the timing precision similar to that for the timing design of the memory cell array is required even for the timing design of the testing circuit. That is, this has the problem that the design of the testing circuit is difficult.

Also, JP-P 2000-353399A has a problem that an area overhead of the row test circuit is large. This test method monitors the word line in order to judge whether or not the word line is selected. The method monitors the word line based on the judgment using a logical level. Thus, in order to carry out the method, a latch circuit (row test circuit) is required to be arranged for each word line. However, a plurality of transistors is required for each latch circuit. Thus, the area overhead becomes very large.

A simple test method that does not require reading from and writing to a memory cell is desired.

SUMMARY

The present invention seeks to solve one or more of the above problems, or to improve upon those problems at least in part.

In one embodiment, a semiconductor device includes: a plurality of word lines configured to be connected to gates of a plurality of memory cell transistors, respectively; a word line driver configured to supply one of a selection voltage and a non-selection voltage to each of the plurality of word lines; a first detection circuit configured to detect a first current flowing into the word line driver through a wiring supplying the selection voltage when the selection voltage is supplied to one of the plurality of word lines through the word line driver; and a control circuit configured to detect abnormality of the plurality of word lines and the word line driver based on the first current.

In another embodiment, a method of detecting abnormality on a semiconductor device including a plurality of memory cell transistors, includes: supplying, through a word line driver which supplies one of a selection voltage and a non-selection voltage to each of a plurality of word lines connected to gates of the plurality of memory cell transistors, respectively, the selection voltage to one of the plurality of word lines; detecting a first current flowing into the word line driver through a wiring supplying the selection voltage; and detecting abnormality of the plurality of word lines and the word line driver based on the first current.

According to the present invention, it is possible to execute a simple test method that does not require reading from and writing to a memory cell.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiments of a semiconductor device and a method of detecting abnormality on a semiconductor device according to the present invention will be described below with reference to the attached drawings.

First Embodiment

Figure 1:
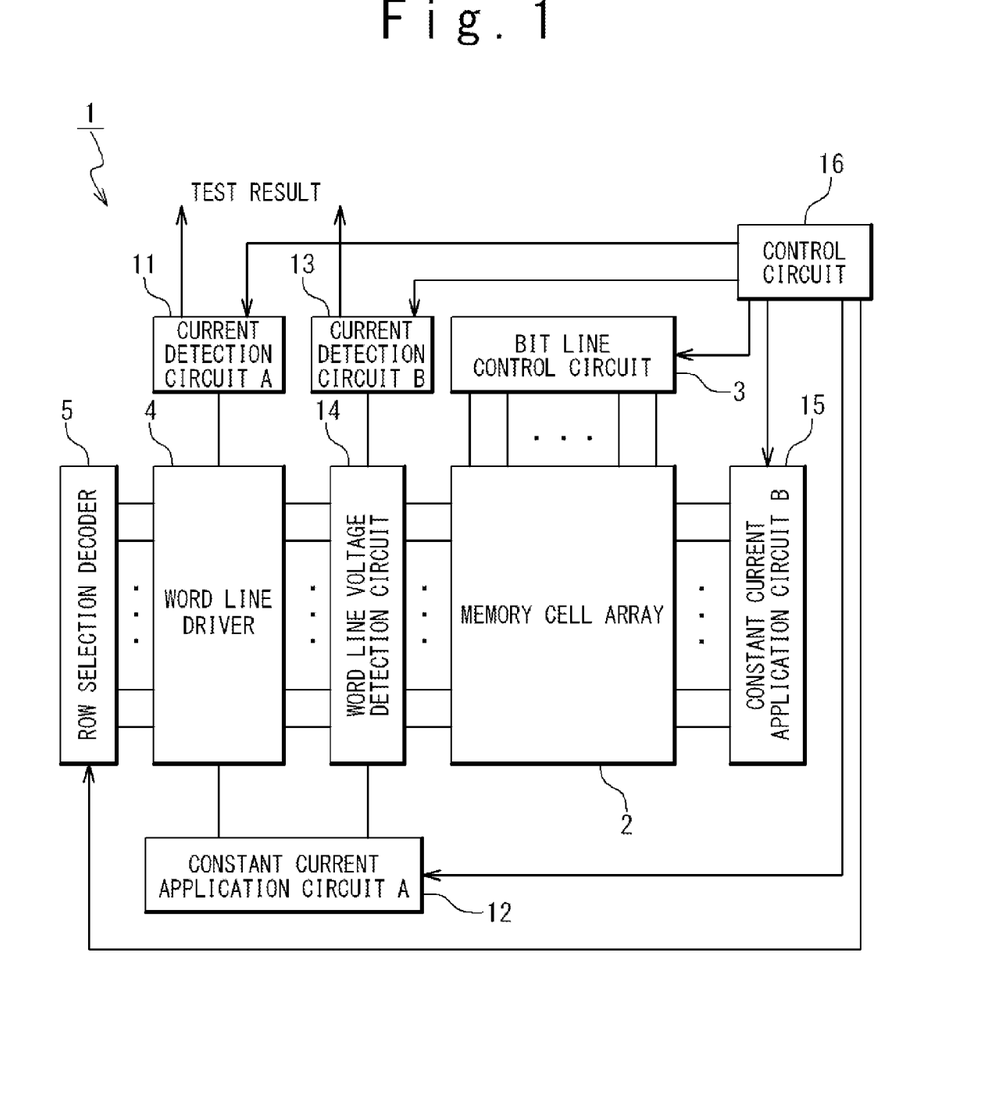
FIG. 1 is a block diagram showing a configuration of a semiconductor device according to embodiments of the present invention.

A configuration of the semiconductor device according to the first embodiment of the present invention will be described below. FIG. 1 is a block diagram showing the configuration of the semiconductor device according to the first embodiment of the present invention. A semiconductor device 1 is a device including a memory circuit, and exemplified as a memory or a memory embedded microcomputer. The semiconductor device 1 includes a memory cell array 2, a bit line control circuit 3, a word line driver 4, a row selection decoder 5, a current detection circuit A 11, a constant current application circuit A 12, a current detection circuit B 13, a word line voltage detection circuit 14 and a constant current application circuit B 15.

The memory cell array 2 includes: a plurality of bit lines laid in a Y-direction; a plurality of word lines laid in an X-direction; and a plurality of memory cells arranged at respective intersections of the plurality of bit lines and the plurality of word lines. The memory cell includes a memory cell transistor whose gate is connected to the word line. The memory cell is exemplified as a DRAM cell, a SRAM cell and a flash cell. Here, the memory cell transistor may be a usual transistor such as a selection transistor in the DRAM cell and the SRAM cell, or may be a transistor having a function for storing an information such as a flash memory cell.

The bit line control circuit 3 is connected to the plurality of bit lines. The bit line control circuit 3 executes the selection of the bit line, the reading and writing operations, the test procedure and the like based on a control signal from a control circuit 16. The bit line control circuit 3 includes a column selection decoder, a sensing amplifier and I/O. The word line driver 4 is connected to the row selection decoder 5 and further connected to the plurality of word lines. The word line driver 4 drives the plurality of word lines through the row selection decoder 5 based on a control signal from the control circuit 16. That is, the word line driver 4 supplies a selection voltage or non-selection voltage to each of the plurality of word lines. Consequently, the word line driver 4 executes the selection of the word line, the test procedure and the like.

The current detection circuit A 11 is connected to the word line driver 4. The current detection circuit A 11 detects whether or not the word line is normally "selected" at the time of the test using a value of a current, based on a control signal from the control circuit 16. The current detection circuit A 11 is used together with the constant current application circuits A 12 and B 15 at the time of the test. The current detection circuit B 13 is connected to the word line voltage detection circuit 14. The current detection circuit B 13 detects whether or not the word line is in the normal "non-selection state" at the time of the test using a value of a current, based on a control signal from the control circuit 16. The current detection circuit B 13 is used together with the word line voltage detection circuit 14 and the constant current application circuit A 12 at the time of the test.

The constant current application circuit A 12 is connected to the word line driver 4 and the word line voltage detection circuit 14. The constant current application circuit A 12 supplies a constant current to the word line driver 4 and the word line voltage detection circuit 14 at the time of the test, based on the control signal from the control circuit 16. The constant current application circuit B 15 is connected through the word line to the memory cell array 2. The constant current application circuit B 15 is arranged at a position opposite to the word line driver 4, with the memory cell array 2 between. The constant current application circuit B 15 supplies a constant current to the word line at the time of the test, based on a control signal from the control circuit 16.

The word line voltage detection circuit 14 is arranged between the word line driver 4 and the memory cell array 2. The word line voltage detection circuit 14 detects whether the word line is in the non-selection state, selection state or middle state at the time of the test, and transmits to the current detection circuit B 13.

The control circuit 16 carries out: controls of the memory cell array 2, the bit line control circuit 3 and the row selection decoder 5 in the case of the normal operation of the memory cell array 2; and controls of the memory cell array 2, the bit line control circuit 3, the row selection decoder 5, the current detection circuit A 11, the constant current application circuit A 12, the current detection circuit B 13, the word line voltage detection circuit 14 and the constant current application circuit B 15 in the case of an abnormality detection operation (test). Hereinafter, the current detection circuit A 11, the constant current application circuit A 12, the current detection circuit B 13, the word line voltage detection circuit 14 and the constant current application circuit B 15 are also referred to as the test circuit. The control circuit 16 executes, for example, an address control and a mode control (an input setting to the test circuit (VBIAS, VREF1, VREF2 and the like), judgments of outputs OUT1 and OUT2, and the like), in the abnormality detection operation (test).

The control circuit 16 may be arranged in one circuit or may be arranged in a plurality of circuits depending on a function. For example, as for the address control, a BIST circuit (in the case of the memory) or a CPU (in the case of the memory embedded microcomputer) may be used as the control circuit 16. Also, as for the mode control, a dedicated circuit arranged inside a memory macro may be used as the control circuit 16.

Incidentally, in the normal memory operation, the current detection circuits A 11 and B 13, the word line voltage detection circuit 14 and the constant current application circuits A 12 and B 15 are inactivated.

Figure 2:
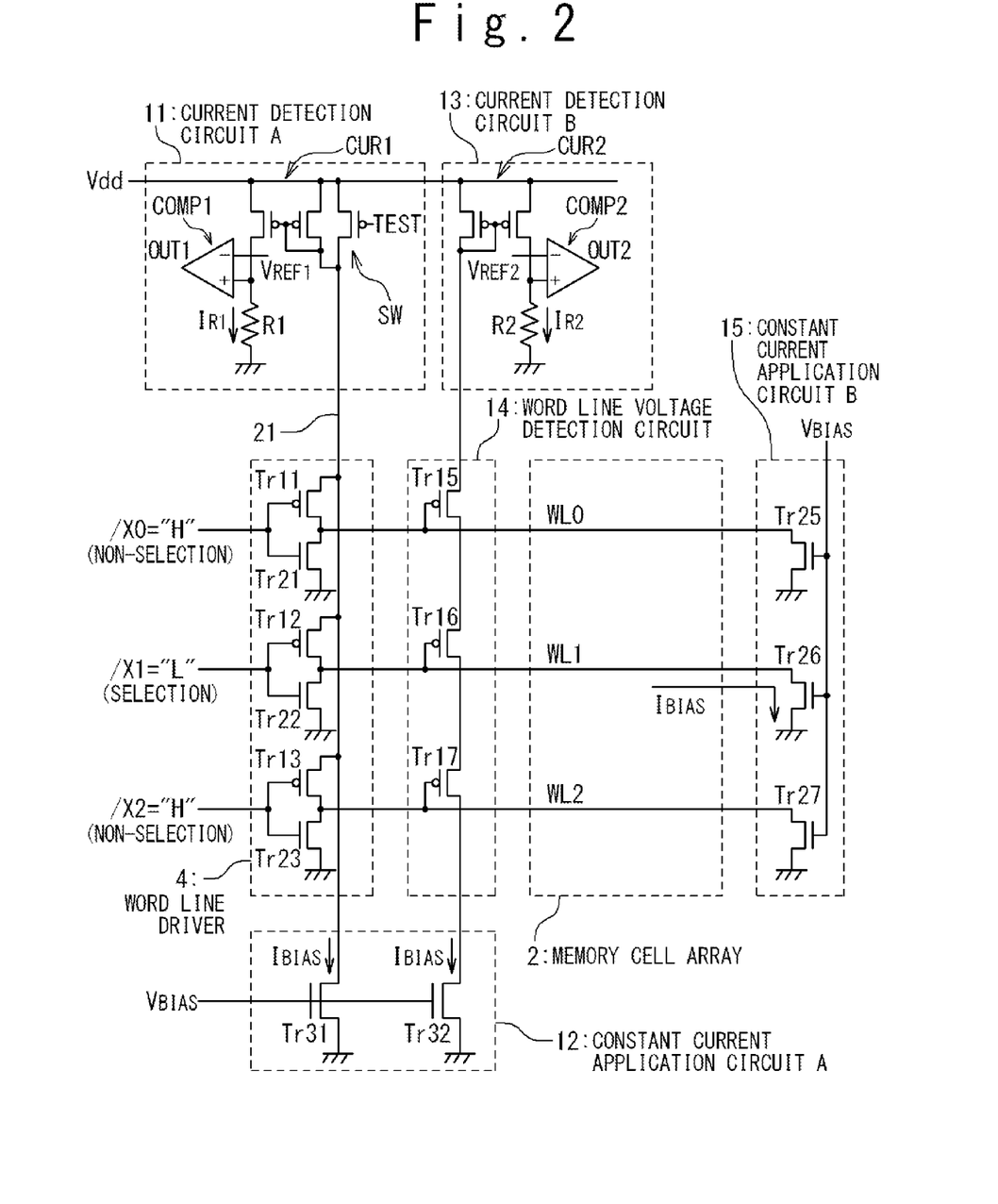
FIG. 2 is a block diagram partially showing a configuration of a semiconductor device according to a first embodiment of the present invention in detail.

FIG. 2 is a block diagram partially showing an example of the configuration of the semiconductor device according to the first embodiment of the present invention. Here, in FIG. 2, the illustration elements of the bit line and the memory cell in the memory cell array 2 are omitted.

The current detection circuit A 11 includes a power source switch SW, a current mirror circuit CUR1, a resistor R1 and a comparator COMP1

The power source switch SW is arranged between a power source voltage Vdd and the word line driver 4. For example, the power source switch SW is composed of a pMOS transistor and turned ON or OFF by a control signal TEST from the control circuit 16. The power source switch SW is turned ON at the time of the normal memory cell operation, and through the power source switch SW, the power source voltage Vdd is supplied to the word line driver 4. On the other hand, the power source switch SW is turned OFF at the time of the test so that the power source voltage Vdd is not directly supplied to the word line driver 4.

In the current mirror circuit CUR1, its input side is arranged between the power source voltage Vdd and the word line driver 4, and its output side is arranged between the power source voltage Vdd and the resistor R1. For example, the current mirror circuit CUR1 is composed of pMOS transistors. The resistor R1 is connected to a ground potential. The current mirror circuit CUR1 is operated at the time of the test (power source switch SW: OFF) and monitors the current flowing into the word line driver 4. That is, the current mirror circuit CUR1 detects the current flowing through the input side of the current mirror circuit CURL as a current $I_{R1}$ flowing through the output side. Here, the current $I_{R1}$ is detected as a voltage ($I_{R1} \times R1$) using the resistor R1.

In the comparator COMP1, a voltage ($I_{R1} \times R1$) of a connection point between the output side of the current mirror circuit CUR1 and the resistor R1 is supplied to a non-inversion input terminal, and a reference voltage $V_{REF1}$ is supplied to an inversion input terminal. Then, the compared result between both of the voltages (the monitored result by the current mirror circuit CUR1) is outputted as an output OUT1 to the control circuit 16.

The constant current application circuit A 12 includes two nMOS transistors Tr31 and Tr32. A drain of the nMOS transistor Tr31 is connected to a wiring 21 that serves as a power source line of the word line driver 4 at the time of the normal memory operation. A drain of the nMOS transistor Tr32 is connected to the word line voltage detection circuit 14. Sources of both the nMOS transistors Tr31 and Tr32 are connected to the ground potential. At the time of the normal memory operation, 0 V is applied from the control circuit 16 to gates of both of the nMOS transistors Tr31 and Tr32. At the time of the test, $V_{BIAS}$ is applied from the control circuit 16 to the gates of both of the nMOS transistors Tr31 and Tr32. As a result, both of the nMOS transistors Tr31 and Tr32 are turned OFF at the time of the normal memory operation. On the other hand, both of the nMOS transistors Tr31 and Tr32 are turned ON at the time of the test and a constant current $I_{BIAS}$ flows between the drain and the source in the nMOS transistor (s).

The constant current application circuit B 15 includes nMOS transistors Tr25, Tr26, Tr27, . . . , which are arranged in the plurality of word lines WL, respectively. A drain of each of the nMOS transistors is connected to the corresponding word line WL. At the time of the normal memory operation, 0 V is commonly supplied to gates of the nMOS transistors Tr25, Tr26, Tr27, . . . from the control circuit 16. At the time of the test, $V_{BIAS}$ is commonly applied to the gates of the nMOS transistors Tr25, Tr26, Tr27, . . . from the control circuit 16. As a result, the nMOS transistors Tr25, Tr26, Tr27, . . . are commonly turned OFF at the time of the normal memory operation. On the other hand, at the time of the test, the nMOS transistors Tr25, Tr26, Tr27, . . . are commonly turned ON, and by selecting the word line WL, the constant current $I_{BIAS}$ flows between the drain and the source in the nMOS transistor connected to the selected word line WL.

The word line voltage detection circuit 14 includes pMOS transistors Tr15, Tr16, Tr17, . . . , which are arranged at the plurality of word lines WL, respectively. A gate of each of the pMOS transistors is connected to the corresponding word line WL. A drain of each of the pMOS transistors is connected to a source of the adjacent pMOS transistor. That is, the pMOS transistors Tr15, Tr16, Tr17, . . . , are connected in series to each other. The source of the pMOS transistor arranged at one endmost position is connected to the current detection circuit B 13. The drain of the pMOS transistor arranged at the other endmost position is connected to the constant current application circuit A 12. The respective pMOS transistors can be regarded as the switches arranged on the current route from the current detection circuit B 13 to the constant current application circuit A 12.

A current detection circuit A 13 includes a current mirror circuit CUR2, a resistor R2 and a comparator COMP2.

In the current mirror circuit CUR2, its input side is arranged between the power source voltage Vdd and the word line voltage detection circuit 14, and its output side is arranged between the power source voltage Vdd and the resistor R2. The current mirror circuit CUR2 is composed of, for example, the pMOS transistors. The resistor R2 is connected to the ground potential. The current mirror circuit CUR2 monitors the current flowing into the word line voltage detection circuit 14. That is, the current mirror circuit CUR2 detects the current flowing through the input side of the current mirror circuit CUR2 as a current $I_{R2}$ flowing through the output side. Here, the current $I_{R2}$ is detected as a voltage ($I_{R2} \times R2$) using the resistor R2.

In the comparator COMP2, the voltage ($I_{R2} \times R2$) of a connection point between the output side of the current mirror circuit CUR2 and the resistor R2 is supplied to a non-inversion input terminal, and a reference voltage $V_{REF2}$ is supplied to an inversion input terminal. Then, the compared result between both of the voltages (the monitored result by the current mirror circuit CUR2) is outputted as an output OUT2 to the control circuit 16.

The word line driver 4 is supplied with a selection voltage from the wiring 21 through the power source switch SW. The selection voltage is supplied to an inverter arranged for each word line WL as the power source voltage on the high potential side. A non-selection voltage, which is a ground voltage, is supplied to the inverter as the power source voltage on the low potential side. The inverter receives a selection signal as an input and outputs the selection voltage or non-selection voltage to the corresponding word line WL.

Next, a setting method of $V_{REF1}$ and $V_{REF2}$ in the method detecting abnormality on the semiconductor device according to the first embodiment of the present invention will be described below. When a mirror ratio of each of the current mirror circuits CUR1 and CUR2 in the current detection circuits A 11 and B 13 is 1, by selecting (setting) the $V_{REF1}$ and the $V_{REF2}$ as follows, the test for the word line WL and the word line driver 4 can be executed.

(1) Test of Selection State of Word Line WL

No word line WL is selected (the word line driver 4 is abnormal, or the word line WL is disconnected):

$$I_{R1}=I_{BIAS} \quad (A1)$$

One word line WL is selected (normal):

$$I_{R1}=2 \times I_{BIAS} \quad (A2)$$

Two or more word lines WL are selected (abnormality of the word line driver 4 causes the word lines WL to be multiply selected, or the word lines WL are electrically shorted):

$$I_{R1} \geq 3 \times I_{BIAS} \quad (A3)$$

Here, for the judgments in (A1) and (A2), the $V_{REF1}$ that satisfies the following equation (C1) is selected.

$$I_{BIAS} \times R1 < V_{REF1} < 2 \times I_{BIAS} \times R1 \quad (C1)$$

At that time, if OUT1="H", it can be judged to be normal. Here, the $V_{REF1}$ is preferred to have a value ($2 \times I_{BIAS} \times R1 - \delta$) that is slightly smaller than ($2 \times I_{BIAS} \times R1$). This is because the precision of the judgment in the abnormality detection method that will be described later can be made high.

On the other hand, for the judgments in (A2) and (A3), the $V_{REF1}$ that satisfies the following equation (C2) is selected.

$$2 \times I_{BIAS} \times R1 < V_{REF1} < 3 \times I_{REF1} \times R1 \quad (C2)$$

At that time, if OUT1 "L", it can be judged to be normal. Here, the $V_{REF1}$ is preferred to have a value ($2 \times I_{BIAS} \times R1 + \delta$) that is slightly greater than ($2 \times I_{BIAS} \times R1$). This is because the precision of the judgment in the abnormality detection method that will be described later can be made high.

(2) Test of Non-Selection State of Word Line WL

All word lines WL are not selected (normal):

$$I_{R2}=I_{BIAS} \quad (B1)$$

Any of word lines WL is in selection state or middle state (the word line driver 4 is abnormal):

$$I_{R2}<I_{BIAS} \quad (B2)$$

Here, note that the $I_{BIAS}$ indicates the value when all the word lines WL are in the normal non-selection state. For the judgments in (B1) and (B2), the $V_{REF2}$ that satisfies the following equation (C3) is selected.

$$0<V_{REF2}<I_{BIAS} \times R2 \quad (C3)$$

At that time, if OUT2="H", it can be judged to be normal. Here, the $V_{REF2}$ is preferred to have a value ($I_{BIAS} \times R2 - \delta$) that is slightly smaller than ($I_{BIAS} \times R2$). This is because the precision of the judgment in the abnormality detection method that will be described later can be made high.

Figure 3A:
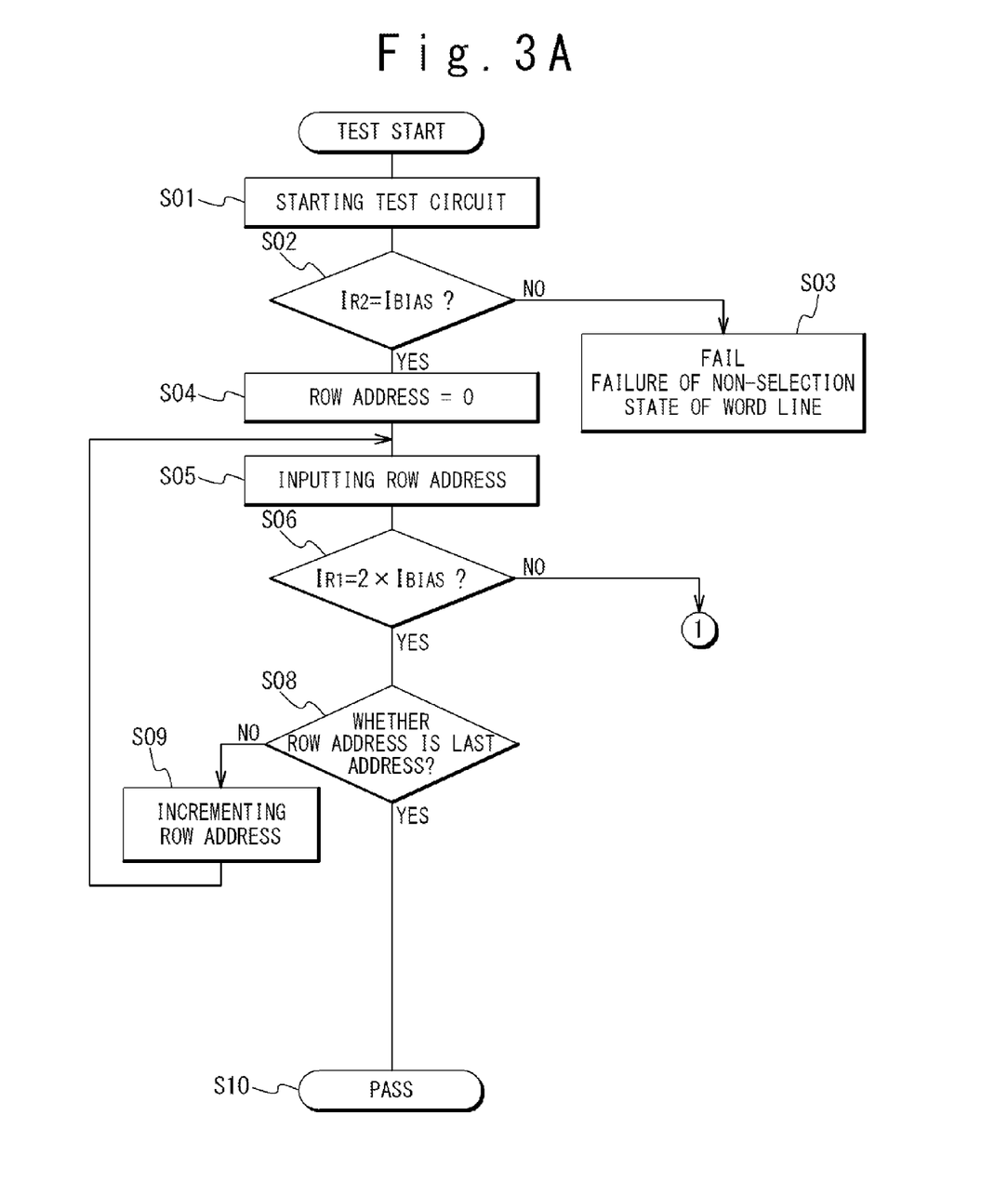
FIG. 3A is a flowchart showing a method of detecting abnormality on the semiconductor device according to the embodiments of the present invention.
Figure 3B:
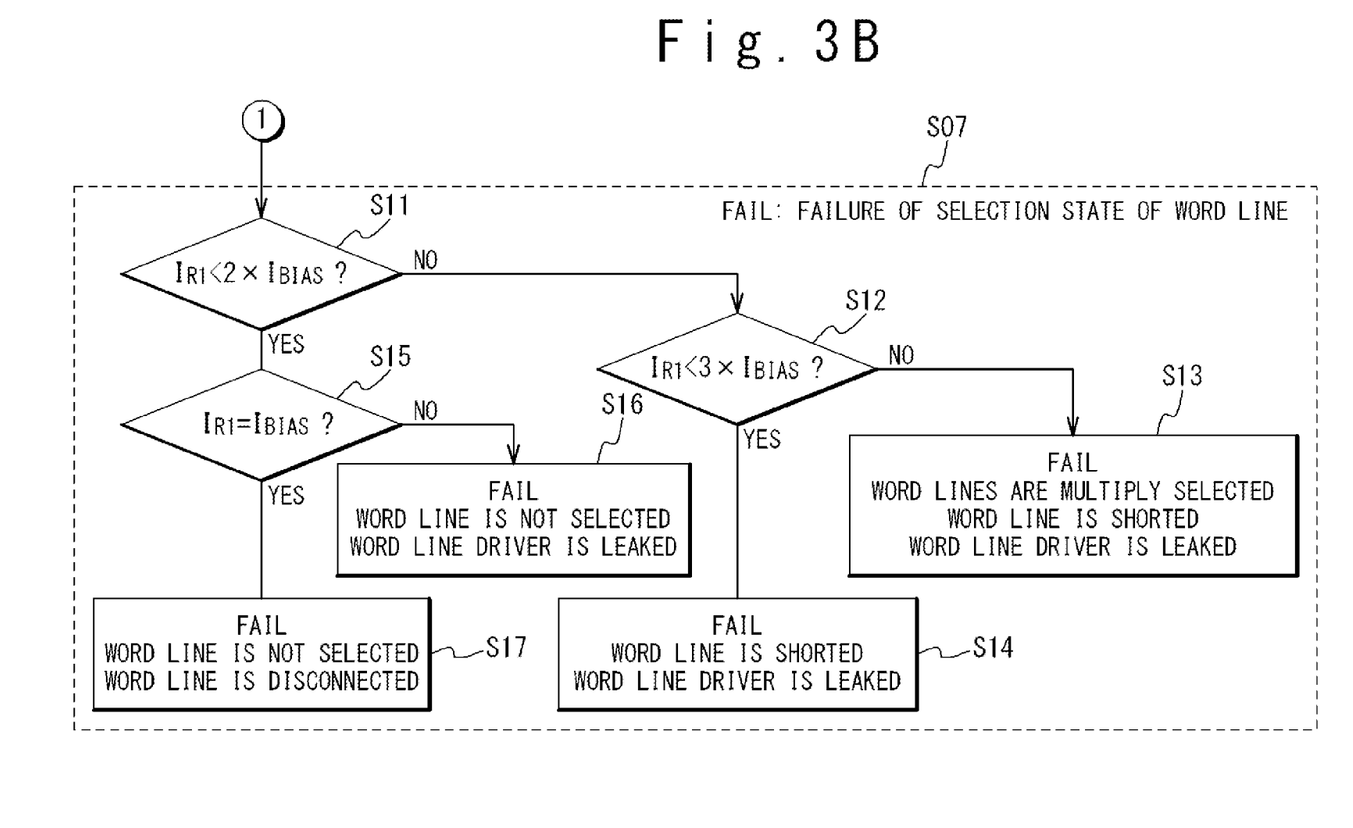
FIG. 3B is a flowchart showing the method of detecting abnormality on the semiconductor device according to the embodiments of the present invention.

The method of detecting abnormality on the semiconductor device (abnormality detection method) according to the first embodiment of the present invention will be described below. FIGS. 3A and 3B are flowcharts showing the method of detecting abnormality on the semiconductor device (abnormality detection method) according to the first embodiment of the present invention. This abnormality detection method (test) is carried out in the following procedure.

The circuits related to the test are started (Step S01). Specifically, the control circuit 16 sets the control signal TEST to an "H" level and turns OFF the power source switch SW. Thus, the power source voltage Vdd is not directly supplied to the word line driver 4. Also, the control circuit 16 applies the control signal $V_{BIAS}$ to the constant current application circuits A 12 and B 15. Hence, when the word line driver 4 and the word line WL are normal, the current route from the word line WL to the ground and the current route from the wiring 21 to the ground are formed.

Next, the non-selection state of the word line WL is inspected (Step S02). The control circuit 16 controls the row selection decoder 5 so that all the word lines WL become in the non-selection state by the word line driver 4, thereby the row selection decoder 5 supplies the signal of the "H" level to the word line driver 4. Thus, if the word line WL and the word line driver 4 are normal, all the word lines WL become in the non-selection state of the "L" level. For example, the signal of the "H" level is supplied to the inputs of the inverter (the pMOS transistor Tr11 and the nMOS transistor Tr21) in the word line driver 4 for the word line WL0. Hence, if the word line WL0 and the word line driver 4 are normal, the word line WL0 becomes in the non-selection state of the "L" level (ground level).

When all the word lines WL become in the "L" level (in the normal case), all of the pMOS transistors in the word line voltage detection circuit 14 are turned ON. Thus, the current route is formed from the constant current application circuit A 12 through all the pMOS transistors in the word line voltage detection circuit 14 to the current detection circuit B 13. As a result, the current $I_{BIAS}$ flows into the input side of the current mirror circuit CUR2 through its current route. Correspondingly to it, the current $I_{R2}$ having the same value as that current flows into the output side of the current mirror circuit CUR2 (mirror ratio: 1). The voltage ($I_{R2} \times R2$) is supplied as the non-inversion input of the comparator COMP2. Here, when $V_{REF2}$ is set as the inversion input as represented by the (C3) of the above (2), the output OUT2 of the comparator COMP2 becomes "H" level. The control circuit 16 judges that the word line non-selection state is normal ($I_{R2}=I_{BIAS}$) on the basis of its inspection result (OUT2) (Step S02: Yes). The control circuit 16 may output the result, which indicates the normality of the non-selection state of the word line WL, as the test result to the outside.

On the other hand, when one of the word lines WL becomes in the "H" level (or middle level) (in the abnormal case), the corresponding pMOS transistor in the word line voltage detection circuit 14 is turned OFF (or becomes in the middle level). Thus, the current route from the constant current application circuit A 12 through all of the pMOS transistors in the word line voltage detection circuit 14 to the current detection circuit B 13 is disconnected at that pMOS transistor (or become high resistive). As a result, the current does not flow through the input side of the current mirror circuit CUR2 (or, the slight current flows). Correspondingly to it, as for the current of the output side of the current mirror circuit CUR2, $I_{R2}$ becomes 0 (or, the current $I_{R2}$ having the same value as the slight current flows). The voltage ($I_{R2} \times R2$) is supplied as the non-inversion input of the comparator COMP2. Here, when the inversion input $V_{REF2}$ is set as represented by the (C3) of the above (2), the output OUT2 of the comparator COMP2 becomes "L" level. The control circuit 16 judges that the word line non-selection state is abnormal ($I_{R2}<I_{BIAS}$), on the basis of the inspection result (Step S02: No). When the abnormality is detected, the control circuit 16 outputs the result, which indicates the failure (FAIL) of the non-selection state of the word line WL, as the test result to the outside (Step S03).

In succession, the selection state of the word line WL is inspected (Steps S04 to S07). At first, the control circuit 16 resets the row address (Step S04). After that, the control circuit 16 controls the row selection decoder 5, and the row selection decoder 5 outputs the first row address, which is a target for the inspection of the word line selection state, to the word line driver 4 (Step S05). Specifically, the signal of the "L" level is supplied to the input of the inverter (the pMOS transistor Tr11 and the nMOS transistor Tr21) in the word line driver 4 for the word line WL0. On the other hand, the signal of the "H" level is supplied to the inputs of the inverters (the pMOS transistor Tr12 and the nMOS transistor Tr22, the pMOS transistor Tr13 and the nMOS transistor Tr23, . . . ) in the word line driver 4 for the word lines WL1, WL2, . . . , simultaneously. Thus, if the word line WL and the word line driver 4 are normal, the word line WL0 targeted for the inspection is selected and becomes in the selection state (the "H" level), and the other word lines WL1, WL2, . . . are not selected and become in the non-selection state (the "L" level).

If the word line WL0 is selected and becomes in the "H" level and if the other word lines WL are not selected and become in the "L" level (the normal case), at first, the pMOS transistor Tr11 in the word line driver 4 for the word line WL0 is turned ON, and the nMOS transistor Tr21 is turned OFF. Then, the current route is formed through the current detection circuit A 11, the pMOS transistor Tr11, the word line WL0 and the nMOS transistor Tr25 in the constant current application circuit B 15 to the ground. Also, the current route is formed through the current detection circuit A 11, the wiring 21 and the nMOS transistor Tr31 in the constant current application circuit A 12 to the ground. Here, since the same control signal $V_{BIAS}$ is applied to the nMOS transistor Tr25 and the nMOS transistor Tr31, the currents flowing through those two current routes become the same current $I_{BIAS}$. As a result, through those two current routes, the current $2 \times I_{BIAS}$ flows through the input side of the current mirror circuit CUR1. Correspondingly to it, the current $I_{R1}$ (=$2 \times I_{BIAS}$) having the same value as that current flows through the output side of the current mirror circuit CUR (Mirror Ratio: 1). The voltage ($I_{R1} \times R1 = 2 \times I_{BIAS} \times R1$) is supplied as the non-inversion input of the comparator COMP1. Here, when the $V_{REF1}$ is set as the inversion input as represented by the (C1) of the above (1), the output OUT1 of the comparator COMP1 becomes "H" level. Moreover, at the next timing, when the $V_{REF1}$ is set as the inversion input as represented by the (C2) of the above (1), the output OUT1 of the comparator COMP1 becomes "L" level. The control circuit 16 judges that the word line selection state is normal ($I_{R1}=2 \times I_{BIAS}$), on the basis of the two inspection results (OUT1) (Step S06: Yes). The control circuit 16 may output the result, which indicates the normality of the selection state of the word line WL0, as the test result to the outside.

If the word line WL0 is not selected and becomes in the "L" level (the word line WL is not selected at all) (the abnormal case), the current route is not formed through the current detection circuit A 11, the word line driver 4, the word line WL0 and the nMOS transistor Tr25 in the constant current application circuit B 15 to the ground. That is, the current does not flow through the current route. Thus, the current $I_{BIAS}$, which is decreased by $I_{BIAS}$ as compared with the normal case, flows through the input side of the current mirror circuit CUR1. Correspondingly to it, the current $I_{R1}$ (=$I_{BIAS}$) having the same value as that current flows through the output side of the current mirror circuit CUR1. The voltage ($I_{R1} \times R1 = I_{BIAS} \times R1$) is supplied as the non-inversion input of the comparator COMP1. Here, when the $V_{REF1}$ is set as the inversion input as represented by the (C1) of the above (1), the output OUT1 of the comparator COMP1 becomes "L" level. The control circuit 16 judges that the word line selection state is abnormal ($I_{R1}=I_{BIAS}$) on the basis of this inspection result (OUT1) (Step S06: No). If the abnormality is detected, the control circuit 16 outputs the result, which indicates the failure (FAIL) of the selection state of the word line WL, as the test result to the outside (Step S07).

Or, if the plurality (m, m≧2) of word lines WL are selected (the abnormal case), the plurality of current routes are formed through the current detection circuit A 11, the word line driver 4, the word lines WL and the nMOS transistors in the constant current application circuit B 15. Thus, the current ((m+1)×$I_{BIAS}$), which is increased by ((m−1)×$I_{BIAS}$) as compared with the normal case, flows through the input side of the current mirror circuit CUR1. Correspondingly to it, the current $I_{R1}$ (=(m+1)×$I_{BIAS}$) having the same value as that current flows through the output side of the current mirror circuit CUR1. The voltage ($I_{R1} \times R1 = (m+1) \times I_{BIAS} \times R1$) is supplied as the non-inversion input of the comparator COMP1. Here, when the $V_{REF1}$ is set as the inversion input as represented by the (C2) of the above (1), the output OUT2 of the comparator COMP1 becomes "H" level. The control circuit 16 judges that the word line non-selection state is abnormal ($I_{R1}=(m+1) \times I_{BIAS}$) on the basis of this inspection result (OUT1) (Step S06: No). If the abnormality is detected, the control circuit 16 outputs the result, which indicates the failure (FAIL) of the selection state of the word line WL, as the test result to the outside (Step S07).

If the step S06 is Yes, the control circuit 16 judges that there is no abnormality in the word line WL corresponding to that row address and the word line driver 4 and judges whether or not the test is completed for all of the word lines WL (Step S08). If the test is completed for all the word lines WL (Step S08: Yes), the control circuit 16 judges that the semiconductor device targeted for the test passes the test (PASS) and outputs that test result to the outside (Step S10). On the other hand, if there is the word line WL for which the test is not completed (Step S08: No), the row address is incremented by one row (Step S09), and until the test is completed for all the word lines WL, the steps S05 to S09 are similarly repeated for the subsequent word lines WL.

Incidentally, for the failure of the selection state of the word line WL at the step S07, the following test can be carried out in order to check the content of the abnormality.

At first, the detected current $I_{R1}$ and the current $2 \times I_{BIAS}$ of the normal time are compared (Step S11). That is, $V_{REF1}$ ($I_{BIAS} \times R1 < V_{REF1} < 2 \times I_{BIAS} \times R1$) is set as the inversion input of the comparator COMP1 as represented by the (C1) of the above (1). At this time, if the output OUT1 of the comparator COMP1 is "L", $I_{R1} < 2 \times I_{BIAS}$ is judged (Step S11: Yes).

If the step S11 is Yes, the detected current $I_{R1}$ and the current $I_{BIAS}$ flowing through the wiring 21 are compared to test whether or not $I_{R1} = I_{BIAS}$ (Step S15). Specifically, if the output OUT1 of the comparator COMP1 is "H" when $V_{REF1} = I_{BIAS} \times R1 - \alpha$ ($\alpha > 0$) is set and if the output OUT1 of the comparator COMP1 is "L" when $I_{R1} = I_{BIAS} \times R1 + \alpha$ ($\alpha > 0$) is set, $I_{R1} = I_{BIAS}$ is judged (Step S15: Yes).

In this case (Step S11: Yes, and Step S15: Yes), it can be estimated that the word line WL is not selected (the word line driver 4 is abnormal) or that the word line WL is disconnected (the word line WL is abnormal) (Step S17).

In the case that the step S11 is Yes, as the result of the comparison between the detected current $I_{R1}$ and the current $I_{BIAS}$ flowing through the wiring 21 (Step S15), specifically, if the output OUT1 of the comparator COMP1 is "H" when $V_{REF1} = I_{BIAS} \times R1 + \alpha$ ($\alpha > 0$) is set, $I_{R1} > I_{BIAS}$ is judged (Step S15: No).

In this case (Step S11: Yes, and Step S15: No), it can be estimated that the word line WL is not normally selected and the word line driver 4 is leaked (indicating that the word line driver 4 is abnormal) (Step S16).

On the other hand, as the result of the comparison between the detected current $I_{R1}$ and the current $2 \times I_{BIAS}$ of the normal time (Step S11), if the output OUT1 of the comparator COMP1 is "H", $I_{R1} > 2 \times I_{BIAS}$ is judged (Step S11: No).

If the step S11 is No, the detected current $I_{R1}$ and the current $3 \times I_{BIAS}$ flowing through the wiring 21 and the plurality of word lines WL are compared (Step S12). That is, $V_{REF1}$ ($2 \times I_{BIAS} \times R1 < V_{REF1} < 3 \times I_{REF1} \times R1$) is set as the inversion input of the comparator COMP1, as represented by the (C2) of the above (1). At this time, if the output OUT1 of the comparator COMP1 is "L", $I_{R1} < 3 \times I_{BIAS}$ is judged (Step S12: Yes).

In this case (Step S11: No, and Step S12: Yes), it can be estimated that the word line WL is shorted (the word line WL is abnormal) or the word line driver 4 is leaked (the word line driver 4 is abnormal) (Step S14).

On the other hand, in the case that the step S11 is No, as the result of the comparison between the detected current $I_{R1}$ and the current $3 \times I_{BIAS}$ flowing through the wiring 21 and the plurality of word lines WL (Step S12), if the output OUT1 of the comparator COMP1 is "H", $I_{R1} > 3 \times I_{BIAS}$ is judged (Step S12: No).

In this case (Step S11: No, and Step S12: No), it can be estimated that the word lines WL are multiply selected (the word line driver 4 is abnormal), the word line WL is shorted (the word line WL is abnormal), or the word line driver 4 is leaked (the word line driver 4 is abnormal) (Step S13).

As mentioned above, the method of detecting abnormality on the semiconductor device (the abnormality detection method) according to this embodiment is executed.

As mentioned above, in the present embodiment, the above testing circuit is used to test the word line and the word line driver under the constant current. The main timing control in the test (the abnormality detection method) is only to perform the address switching on the word line targeted for the test. Thus, the complex timing control for the test as described in JP-A-Heisei 5-159600 is unnecessary. Moreover, not only the circuit of the usual memory macro can be used for the address control, but also the word line WL and the word line driver 4 are tested under the constant current. Thus, the testing circuit can be attained by using the simple circuit. Hence, the problem of the JP-A-Heisei 5-159600, in which the design of the circuit for detecting the dynamically changing signal is difficult, can be solved. Also, it is possible to execute the test in a short time because the reading from and writing to the memory cell is unnecessary.

Also, the circuit added near the memory cell array is substantially only the above testing circuit. Thus, as compared with the circuit of JP-P 2000-353399A, the number of the transistors configuring the testing circuit is small. Typically, the number of the transistors in the testing circuit required for each word line is about 2 in the present embodiment, which is about 1/10 of the circuit in JP-P 2000-353399A. Moreover, the current detection circuits A 11 and B 13, which are arranged in the corner regions between the row selection decoder and the column selection decoder, can be composed of the transistors of the small sizes if the current value of the test reference current ($I_{BIAS}$) is selected such that the voltage drop caused by the resistors in the current route is small and the current value does not fall below the leakage current of the current route. Thus, when the above test circuit is used, the area overhead can be decreased to a very small value. Hence, the problem of the JP-P 2000-353399A, in which the area overhead is great because the latch circuit is arranged for each word line, can be solved.

According to the present invention, it is possible to execute the simple test method that does not require the reading from and writing to the memory cell.

Second Embodiment

The configuration of the semiconductor device according to the second embodiment of the present invention will be described below. This embodiment differs from the first embodiment in the configurations of the current detection circuits A 11 and B 13. The difference from the first embodiment will be mainly described below.

FIG. 1 is the block diagram showing a configuration of the semiconductor device according to the second embodiment of the present invention. The configuration of the semiconductor device 1 in FIG. 1 is similar to that of the first embodiment. Thus, its description is omitted.

Figure 4:
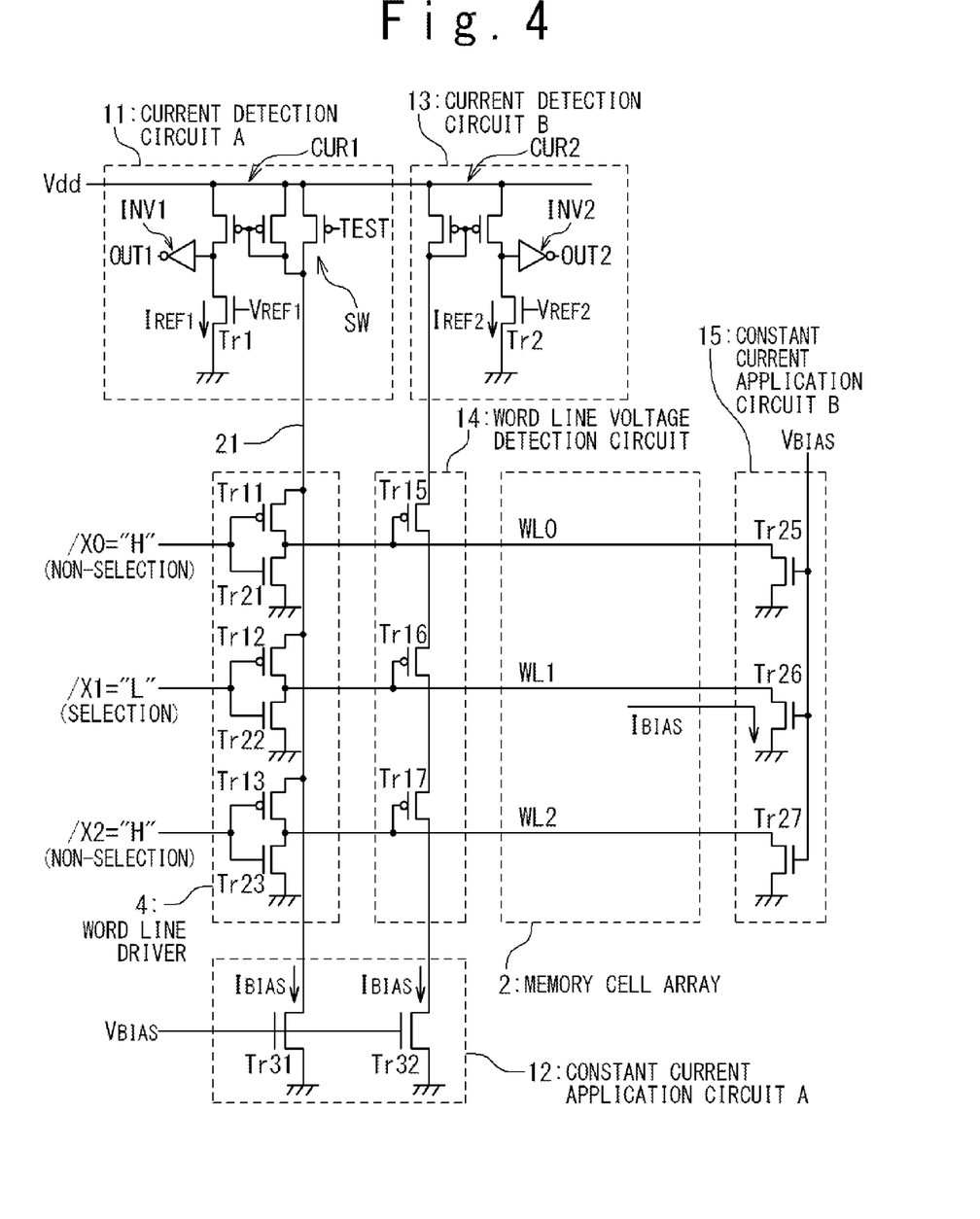
FIG. 4 is a block diagram partially showing a configuration of a semiconductor device according to a second embodiment of the present invention in detail.

FIG. 4 is a block diagram partially showing an example of a configuration of the semiconductor device according to the second embodiment of the present invention in detail. Here, in FIG. 4, the illustration elements of the bit line and the memory cell in the memory cell array 2 are omitted.

This embodiment differs from the configuration of the first embodiment in that in the current detection circuits A 11 and B 13, the comparators COMP1 and COMP2 are replaced with inverters INV1 and INV2, respectively, and the resistors R1 and R2 are replaced with nMOS transistors Tr1 and Tr2, respectively.

In the inverter INV1, its input is connected to the output side of the current mirror circuit CUR1. Its output of the inverter INV1 serves as the output OUT1 of the current detection circuit A 11. Similarly, in the inverter INV2, its input is connected to the output side of the current mirror circuit CUR2. Its output of the inverter INV2 is connected to the output OUT2 of the current detection circuit B 13.

In the nMOS transistor Tr1, the ground voltage is supplied to its source, its drain is connected to the output side of the current mirror circuit CUR1 and the input of the inverter INV1, and the reference voltage $V_{REF1}$ is supplied to its gate. Similarly, in the nMOS transistor Tr2, the ground voltage is supplied to its source, its drain is connected to the output side of the current mirror circuit CUR2 and the input of the inverter INV2, and the reference voltage $V_{REF2}$ is supplied to its gate. At this time, when a drain voltage is sufficiently high, currents $I_{REF1}$ and $I_{REF2}$ flow through the nMOS transistors Tr1 and Tr2, respectively.

The respective currents, which flow through the routes of the word lines WL and the word line driver 4 that are tested, are equal to those of the first embodiment.

In the method of detecting abnormality on the semiconductor device according to the second embodiment of the present invention, the method of setting $\backslash T_{REF1}$ and $V_{REF2}$ will be described below. When the mirror ratio of each of the current mirror circuits CUR1 and CUR2 in the current detection circuits A 11 and B 13 is 1, the word line WL and the word line driver 4 can be tested by selecting the $V_{REF1}$ and the $V_{REF2}$ as follows.

(1) Test of Selection State of Word Line WL

Since the output circuit is the inverter, for the judgment in the above (A1) and (A2), the $V_{REF1}$ that satisfies the following equation (D1) is selected.

$$I_{BIAS} < I_{REF1} < 2 \times I_{BIAS} \quad (D1)$$

At that time, if OUT1="L", it can be judged to be normal. Here, the $I_{REF1}$ is preferred to have a value ($2 \times I_{BIAS} - \delta$) that is slightly smaller than $2 \times I_{BIAS}$. This is because the precision of the judgment in the abnormality detection method can be made high.

On the other hand, for the judgment in the above (A2) and (A3), the $V_{REF1}$ that satisfies the following equation (D2) is selected.

$$2 \times I_{BIAS} < I_{REF1} < 3 \times I_{BIAS} \quad (D2)$$

At that time, if OUT1="H", it can be judged to be normal. Here, the $I_{REF1}$ is preferred to have a value ($2 \times I_{BIAS} + \delta$) that is slightly greater than $2 \times I_{BIAS}$. This is because the precision of the judgment in the abnormality detection method can be made high.

Here, the (A1), (A2) and (A3) are similar to those of the first embodiment.

(2) Test of Non-Selection State of Word Line WL

Since the output circuit is the inverter, for the judgments in the above (B1) and (B2), the $V_{REF2}$ that satisfies the following equation (D3) is selected.

$$0 < I_{REF2} < I_{BIAS} \quad (D3)$$

At that time, if OUT2="L", it can be judged to be normal. Here, the $I_{REF2}$ is preferred to have a value ($I_{BIAS} - \delta$) that is slightly smaller than $I_{BIAS}$. This is because the precision of the judgment in the abnormality detection method can be made high.

Here, the (B1) and (B2) are similar to those of the first embodiment.

The method of detecting abnormality on the semiconductor device (abnormality detection method) according to the second embodiment of the present invention will be described below. FIGS. 3A and 3B are flowcharts showing the method of detecting abnormality on the semiconductor device according to the second embodiment of the present invention. This abnormality detection method (test) is similar to that of the first embodiment, except the change on the circuit as mentioned above (the change from FIG. 2 to FIG. 4) and the change of the judgment condition (the change from the (C1) to (C3) to the (D1) to (D3)). Thus, its description is omitted.

Also, in this case, it is possible to obtain the effects similar to those of the first embodiment.

In addition, this embodiment has a merit that the areas of the current detection circuits A 11 and B 13 can be suppressed as compared with the first embodiment. The reason lies in the structures that the comparator (COMP1, COMP2) with the relatively complex configuration in the first embodiment are replaced with the inverter (INV1, INV2) composed of only the two transistors in the second embodiment and that the resistor (R1, R2) in the first embodiment is replaced with the transistor (Tr1, Tr2) in the second embodiment.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor device comprising:
    a plurality of word lines configured to be connected to gates of a plurality of memory cell transistors, respectively;
    a word line driver configured to supply one of a selection voltage and a non-selection voltage to each of said plurality of word lines;
    a first detection circuit configured to detect a first current flowing into said word line driver through a wiring supplying said selection voltage when said selection voltage is supplied to one of said plurality of word lines through said word line driver;
    a control circuit configured to detect abnormality of said plurality of word lines and said word line driver based on said first current; and
    a second detection circuit configured to detect a second voltage of said plurality of word lines when said word line driver supplies said non-selection voltage to said plurality of word lines,
    wherein said control circuit detects abnormality of said plurality of word lines and said word line driver based on the first current and said second voltage.

2. The semiconductor device according to claim 1, wherein first detection circuit includes:
    a first constant current circuit configured to be provided at a side opposite to said word line driver with respect to said plurality of word lines and supply a constant current to one of said plurality of word lines based on supplying of said selection voltage,
    a first current detection circuit configured to be connected to said word line driver, detect said first current, and compare said first current with a first reference current, and a second constant current circuit configured to be connected to said word line driver, be provided at a side opposite to said first current detection circuit with respect to said word line driver, and supply a constant current to said word line driver, wherein said control circuit detects abnormality of said plurality of word lines and said word line driver based on said comparison result of said first current detection circuit.

3. The semiconductor device according to claim 1, wherein said second detection circuit includes:
a word line voltage detection circuit configured to include a plurality of switches, said plurality of switches being turned on and off based on voltages of said plurality of word lines respectively and being connected to each other in series,
a second constant current circuit configured to be connected to one end of said plurality of switches connected in series and supply a constant current to said plurality of switches based on supplying of said non-selection voltage,
a second current detection circuit configured to be connected to the other end of said plurality of switches connected in series, detect said second voltage as a second current flowing through said plurality of switches, and compare said second current with a second reference current,
wherein said control circuit detects abnormality of said plurality of word lines and said word line driver based on said comparison result of said second current detection circuit.

4. The semiconductor device according to claim 2, wherein said first current detection circuit includes:
a first current mirror circuit configured to be connected to said word line driver at an input side, and
a first comparison unit configured to be connected to an output side of said first current mirror circuit and compare a current corresponding to said first current at said input side with said first reference current.

5. The semiconductor device according to claim 3, wherein said second current detection circuit includes:
a second current mirror circuit configured to be connected to said word line voltage detection circuit at an input side, and
a second comparison unit configured to be connected to an output side of said second current mirror circuit and compare a current corresponding to said second current at said input side with said second reference current.

6. The semiconductor device according to claim 4, wherein said first comparison unit includes:
a first conversion circuit configured to be connected to said output side of said first current mirror circuit and converts said current corresponding to said first current at said input side into a first voltage, and
a first comparison circuit configured to be supplied with said first voltage at one input and supplied with a first reference voltage corresponding to said first reference current at the other input.

7. The semiconductor device according to claim 4, wherein said first comparison unit includes:
a transistor configured to be connected to said output side of said first current mirror circuit, supplied with a first reference voltage corresponding to said first reference current at a gate and supplied with said current corresponding to said first current at said input side at a source drain, and
an inverter configured to be connected to said output side of said first current mirror circuit at an input side.

8. The semiconductor device according to claim 5, wherein said second comparison unit includes:
a second conversion circuit configured to be connected to said output side of said second current mirror circuit and converts said current corresponding to said second current at said input side into a third voltage, and
a second comparison circuit configured to be supplied with said third voltage at one input and supplied with a second reference voltage corresponding to said second reference current at the other input.

9. The semiconductor device according to claim 5, wherein said second comparison unit includes:
a transistor configured to be connected to said output side of said second current mirror circuit, supplied with a second reference voltage corresponding to said second reference current at a gate and supplied with said current corresponding to said second current at said input side at a source drain, and
an inverter configured to be connected to said output side of said second current mirror circuit at an input side.

10. The semiconductor device according to claim 2, wherein said second detection circuit includes:
a word line voltage detection circuit configured to include a plurality of switches, said plurality of switches being turned on and off based on voltages of said plurality of word lines respectively and being connected to each other in series,
a second constant current circuit configured to be connected to one end of said plurality of switches connected in series and supply a constant current to said plurality of switches based on supplying of said non-selection voltage,
a second current detection circuit configured to be connected to the other end of said plurality of switches connected in series, detect said second voltage as a second current flowing through said plurality of switches, and compare said second current with a second reference current,
wherein said control circuit detects abnormality of said plurality of word lines and said word line driver based on said comparison result of said second current detection circuit.

11. A method of detecting abnormality on a semiconductor device including a plurality of memory cell transistors, comprising:
supplying, through a word line driver which supplies one of a selection voltage and a non-selection voltage to each of a plurality of word lines connected to gates of said plurality of memory cell transistors, respectively, said selection voltage to one of said plurality of word lines;
detecting a first current flowing into said word line driver through a wiring supplying said selection voltage;
detecting abnormality of said plurality of word lines and said word line driver based on said first current, and
detecting a second voltage of said plurality of word lines when said word line driver supplies said non-selection voltage to said plurality of word lines,
wherein said step of detecting said abnormality includes:
detecting abnormality of said plurality of word lines and said word line driver based on the first current and said second voltage.

* * * * *